United States Patent
Wang et al.

(10) Patent No.: US 8,592,980 B2
(45) Date of Patent: Nov. 26, 2013

(54) CARBON NANOTUBE-MODIFIED LOW-K MATERIALS

(75) Inventors: Shanzhong Wang, Singapore (SG); Valeriy Nosik, Singapore (SG); Tong Yan Tee, Singapore (SG); Xueren Zhang, Singapore (SG)

(73) Assignee: STMicroelectronics Asia Pacific Pte., Ltd., Singapore (SG)

( * ) Notice: Subject to any disclaimer, the term of this patent is extended or adjusted under 35 U.S.C. 154(b) by 77 days.

(21) Appl. No.: 11/715,260

(22) Filed: Mar. 7, 2007

(65) Prior Publication Data

US 2007/0210455 A1    Sep. 13, 2007

Related U.S. Application Data

(60) Provisional application No. 60/780,092, filed on Mar. 8, 2006.

(51) Int. Cl.
*H01L 23/48* (2006.01)
*H01L 23/52* (2006.01)
*H01L 29/40* (2006.01)
*H01L 21/4763* (2006.01)

(52) U.S. Cl.
USPC .... 257/758; 257/759; 257/774; 257/E23.145; 257/E23.154; 257/E23.167; 438/622; 438/623; 438/637; 977/742; 977/788; 977/809; 977/932

(58) Field of Classification Search
USPC .......................................................... 257/758
See application file for complete search history.

(56) References Cited

U.S. PATENT DOCUMENTS

| | | | | |
|---|---|---|---|---|
| 5,391,921 A | * | 2/1995 | Kudoh et al. | 257/758 |
| 5,744,399 A | * | 4/1998 | Rostoker et al. | 438/622 |
| 5,976,979 A | * | 11/1999 | Chen | 438/691 |
| 6,890,654 B2 | * | 5/2005 | Stupp et al. | 428/403 |
| 6,982,206 B1 | * | 1/2006 | Berman et al. | 438/400 |
| 7,229,909 B2 | * | 6/2007 | Furukawa et al. | 438/622 |
| 7,233,071 B2 | * | 6/2007 | Furukawa et al. | 257/759 |
| 7,365,395 B2 | * | 4/2008 | Stumbo et al. | 257/347 |
| 7,413,971 B2 | * | 8/2008 | Steinhogl et al. | 438/597 |
| 2002/0122765 A1 | * | 9/2002 | Horiuchi et al. | 423/447.1 |
| 2004/0043197 A1 | * | 3/2004 | Matsuura | 428/190 |
| 2004/0112964 A1 | * | 6/2004 | Empedocles et al. | 235/491 |
| 2005/0196950 A1 | * | 9/2005 | Steinhogl et al. | 438/622 |
| 2006/0057361 A1 | * | 3/2006 | Ounaies et al. | 428/323 |

(Continued)

FOREIGN PATENT DOCUMENTS

| kR | 2005-0034839 | * | 4/2005 |
|---|---|---|---|
| KR | 20050034839 | * | 4/2005 |

*Primary Examiner* — Hoang-Quan Ho
(74) *Attorney, Agent, or Firm* — Munck Wilson Mandala, LLP

(57) ABSTRACT

An interconnect structure for use in an integrated circuit is provided. The interconnect structure includes a first low-K dielectric material. The first low-K material may be modified with a first group of carbon nanotubes (CNTs) and disposed on a metal line. The first low-K material is modified by dispersing the first group of CNTs in a solution, spinning the solution onto a silicon wafer and curing the solution to form the first low-K material modified with the first CNTs. The metal line includes a top layer and a bottom layer connected by a metal via. The interconnect structure also includes a second low-K dielectric material modified with a second group of CNTs and disposed on the bottom layer. Accordingly, embodiments the present disclosure could help to increase the mechanical strength of the low-K material or the entire interconnect structure.

20 Claims, 3 Drawing Sheets

(56) References Cited

U.S. PATENT DOCUMENTS

| | | | |
|---|---|---|---|
| 2006/0115409 A1* | 6/2006 | Li et al. | 423/447.1 |
| 2007/0096326 A1* | 5/2007 | Chang et al. | 257/764 |
| 2007/0184647 A1* | 8/2007 | Furukawa et al. | 438/622 |
| 2007/0210455 A1* | 9/2007 | Wang et al. | 257/762 |

* cited by examiner

__PATENT_US_8,592,980_B2__

CARBON NANOTUBE-MODIFIED LOW-K MATERIALS

CROSS-REFERENCE TO RELATED APPLICATION AND CLAIM OF PRIORITY

The present application is related to U.S. Provisional Patent No. 60/780,092, filed Mar. 8, 2006, entitled "INTERCONNECT STRUCTURE, INTEGRATED CIRCUIT, AND METHOD HAVING CARBON NANOTUBE-MODIFIED LOW-K MATERIALS". U.S. Provisional Patent No. 60/780,092 is assigned to the assignee of the present application and is hereby incorporated by reference into the present disclosure as if fully set forth herein. The present application hereby claims priority under 35 U.S.C. §119(e) to U.S. Provisional Patent No. 60/780,092.

TECHNICAL FIELD

This disclosure is generally directed to integrated circuits and more specifically carbon nanotube-modified low-K materials.

BACKGROUND

Conventional interconnect structures for integrated circuits are often formed using aluminum as a metallization layer and silicon dioxide as a dielectric. However, while integrated circuits are being continuously scaled down (such as device scaling from the 90 nm node to the 65 nm node and further to the 45 nm node), conventional interconnect structures often suffer from an interconnection delay due to high electrical resistance and parasitic wiring capacitance. These problems are major factors that limit the speed of high performance integrated circuits.

Integrated circuit manufacturers have begun using copper in place of aluminum and a low-K material in place of silicon dioxide in the interconnect structures to address these issues. The copper helps to lower the resistance of the interconnect metallization and increase the reliability of the interconnect structures, while the low-K material helps to reduce the parasitic capacitance between the interconnect structures by providing a lower dielectric constant. However, the ability to reduce the dielectric constant of the low-K material is typically limited, and low-K materials are often mechanically weak.

SUMMARY

This disclosure provides carbon nanotube-modified low-K materials.

In one embodiment, the present disclosure provides an interconnect structure. The interconnect structure includes a low-K dielectric material modified with a first group of carbon nanotubes (CNTs). The low-K material is disposed on a metal line. The metal line includes a top layer and a bottom layer connected by a metal via.

In another embodiment, the present disclosure provides a method of forming an interconnect structure. The method includes providing a first low-K material modified with a first group of carbon nanotubes (CNTs). The method also includes providing a metal line having a top layer and a bottom layer disposed on the first low-K material. The method further includes providing a second low-K material modified with a second group of CNTs where the second low-K material is disposed on the first low-K material.

In still another embodiment, the present disclosure provides an interconnect structure for use in an integrated circuit. The interconnect structure includes a first low-K dielectric material. The first low-K material is modified with a first group of carbon nanotubes (CNTs) and disposed on a metal line. The metal line includes a top layer and a bottom layer connected by a metal via. The interconnect structure also includes a second low-K dielectric material modified with a second group of CNTs and disposed on the bottom layer. The interconnect structure further includes a silicon nitride layer disposed on the top layer and the first low-K dielectric material.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawing, in which.

DETAILED DESCRIPTION

Figure 1:
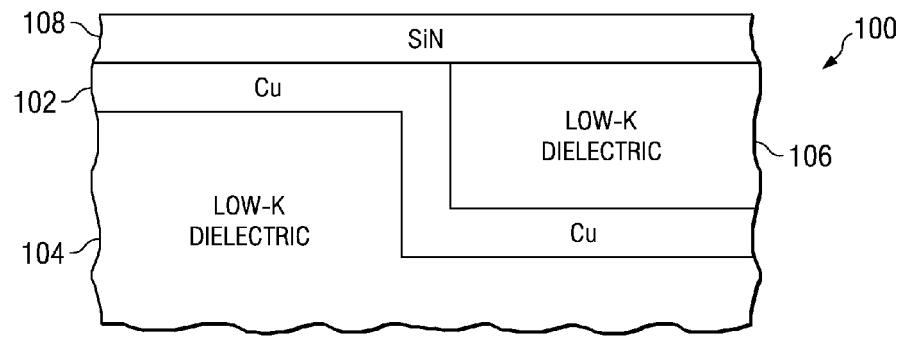
FIG. 1 illustrates a conventional interconnect structure.

FIG. 1 illustrates an interconnect structure 100. In this example, the interconnect structure 100 includes a metal line 102, which in this embodiment includes a top layer and a bottom layer of copper connected by a copper via. One or more low-K materials 104-106 are disposed around the metal line 102. The one or more low-K materials 104-106 could include any suitable number or type of dielectric or other material, including one or more silicon oxycarbides, organic polymers, fluorosilicate glass, or black diamond. A silicon nitride layer 108 is disposed over the metal line 102 and the low-K material 106.

The interconnect structure 100 described above typically suffers from some amount of electrical resistance and parasitic wiring capacitance. The use of copper helps to reduce the electrical resistance. The lowering of the dielectric constant of the low-K materials 104-106 helps to reduce the parasitic wiring capacitance between interconnect structures 100. However, the ability to reduce the dielectric constant of the low-K materials 104-106 is typically limited, and low-K materials 104-106 are often mechanically weak.

Figure 2:
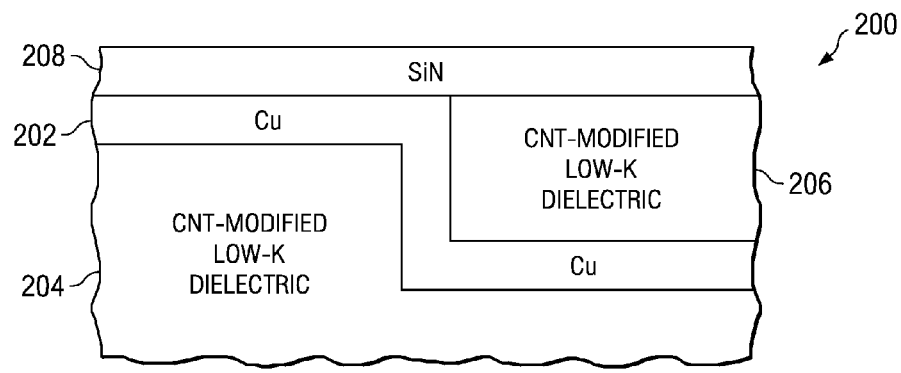
FIG. 2 illustrates an example interconnect structure according to one embodiment of this disclosure.

FIG. 2 illustrates an example interconnect structure 200 according to one embodiment of this disclosure. The embodiment of the interconnect structure 200 shown in FIG. 2 is for illustration only. Other embodiments of the interconnect structure 200 could be used without departing from the scope of this disclosure.

In this example, the interconnect structure 200 includes a metal line 202, such as a copper line having top and bottom copper layers connected by a copper via. The interconnect structure 200 also includes one or more low-K materials 204-206, such as silicon oxycarbides, organic polymers, fluorosilicate glass, or black diamond. A silicon nitride layer 208 is disposed over the metal line 202 and the low-K material 206. Although shown as including a single copper metal line 202 with two metal layers, the interconnect structure 200 could include any number of lines 202, and each line 202 could be formed from any conductive material(s) and have any suitable number of layers.

Figure 3:
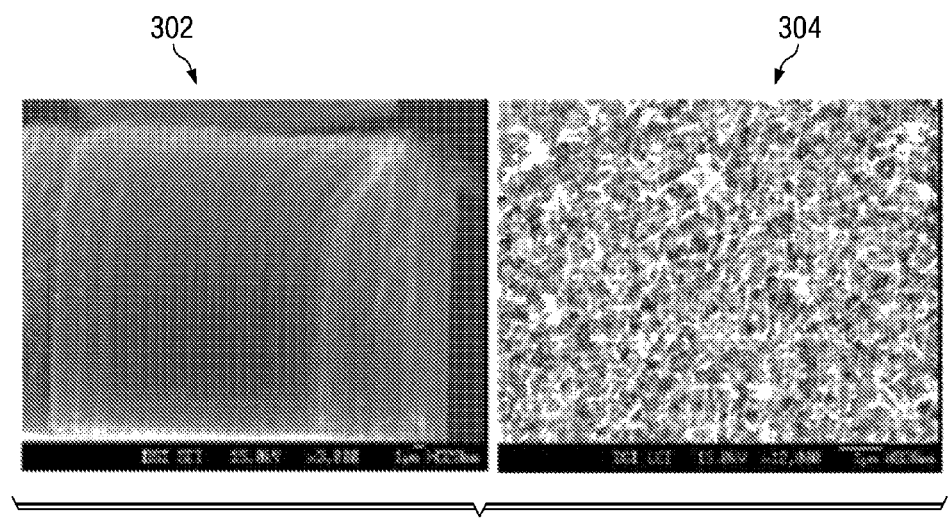
FIG. 3 illustrates carbon nanotubes having different alignments according to one embodiment of this disclosure.

One or more of the low-K materials 204-206 are modified in at least one way using carbon nanotubes. Carbon nanotubes may represent cylindrical carbon molecules with novel properties that make them potentially useful in a wide variety of applications (such as nano-electronics, optics, and materials applications). Carbon nanotubes often exhibit extraordinary strength and unique electrical properties and are often efficient conductors of heat. For example, carbon nanotubes may have a high Young's modulus (1 TPa) and high tensile strength (100 GPa). FIG. 3 illustrates scanning electron microscope images of example carbon nanotubes. In particular, image 302 in FIG. 3 illustrates aligned carbon nanotubes, while image 304 in FIG. 3 illustrates non-aligned carbon nanotubes.

In some embodiments, carbon nanotubes are actually dispersed in and form a part of one or more of the low-K materials 204-206. The carbon nanotubes may help to decrease the dielectric constant of the one or more low-K materials 204-206. Moreover, the mechanical strength and the thermal conductivity of the one or more low-K materials 204-206 may increase. In particular embodiments, the carbon nanotubes may be used in one or both of the low-K materials 204-206.

The carbon nanotubes may have any suitable alignment in one or more of the low-K materials 204-206. For example, the carbon nanotubes may be aligned vertically, horizontally, or in any other suitable manner. The carbon nanotubes could also be unaligned. In addition, the carbon nanotubes may have any suitable arrangement or pattern in one or more of the low-K materials 204-206. As an example, the carbon nanotubes may be arranged in a honeycomb pattern or any other pattern, or no pattern could be used.

Various techniques could be used to fabricate these embodiments of the interconnect structure 200. For example, carbon nanotubes could be created and then cut as short as possible. The carbon nanotubes may then be uniformly dispersed into a solution, and the solution of carbon nanotubes may be mixed with a polymer or sol-gel. The polymer or sol-gel may then be spun onto a silicon wafer and cured to form one or both of the low-K materials 204-206. Any other suitable technique could be used to form these embodiments of the interconnect structure 200.

In other embodiments, carbon nanotubes are used to form pores in one or more low-K materials 204-206 to form one or more nanoporous low-K materials 204-206. A nanoporous low-K material may have a lower dielectric constant than the low-K material itself. Again, the carbon nanotubes used to form the nanopores may have any suitable alignment, arrangement, or pattern in one or more of the low-K materials 204-206.

Various techniques could be used to fabricate these embodiments of the interconnect structure 200. For example, carbon nanotubes could be created and then cut as short as possible. The carbon nanotubes may then be uniformly dispersed into a solution, and the solution of carbon nanotubes may then be mixed with a polymer or sol-gel. The polymer or sol-gel may then be spun onto a silicon wafer, and the carbon nanotubes may be burned away in an oxygen atmosphere, leaving nanopores in the polymer or sol-gel that forms one or more of the low-K materials 204-206. Any other suitable technique could be used to form these embodiments of the interconnect structure 200.

In particular embodiments, the properties of the one or more low-K materials 204-206 may be controlled or tuned using the amount of carbon nanotubes or nanopores in the low-K materials. For example, the dielectric constant, Young's modulus, or thermal conductivity of a low-K material could be tuned based on the amount of carbon nanotubes or nanopores in the low-K material. Moreover, the various embodiments of the interconnect structure 200 described above may be fabricated using relatively simple processing.

Although FIG. 2 illustrates one example of an interconnect structure 200, various changes may be made to FIG. 2. For example, materials other than copper and silicon nitride could be used in the interconnect structure 200. Also, the particular sizes and shapes of the various components in the interconnect structure 200 are for illustration only. The components in the interconnect structure 200 could have any other suitable size or shape. In addition, the low-K materials 204-206 have been described as being formed using carbon nanotubes. However, any other nano-wire fillings or other nano-structures (whether metallic or non-metallic) could be used instead of or in addition to the carbon nanotubes.

Figure 4:
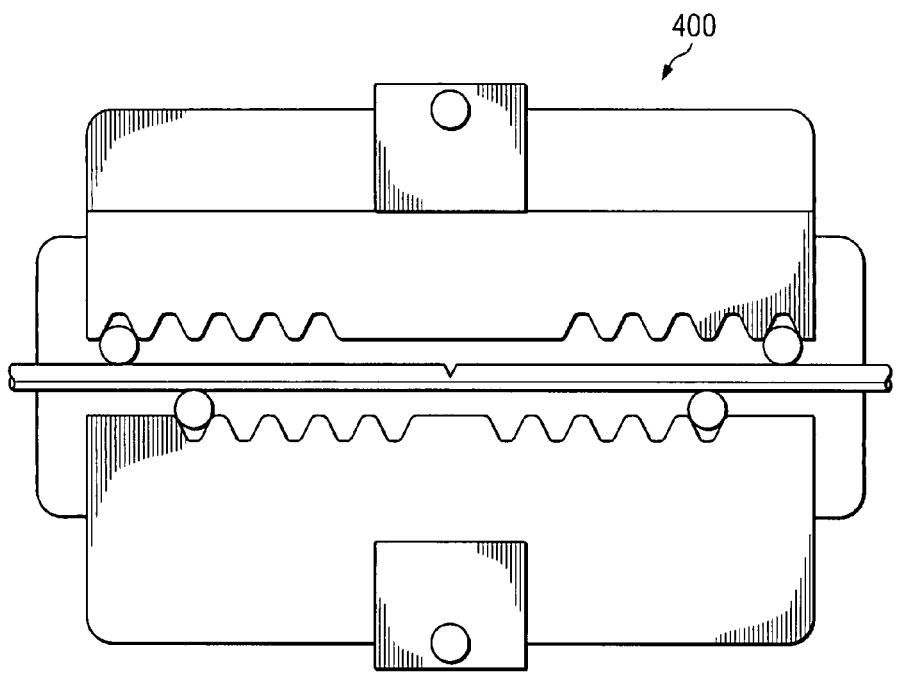
FIG. 4 illustrates an example Four-Point Bend test structure according to one embodiment of this disclosure.
Figure 5:
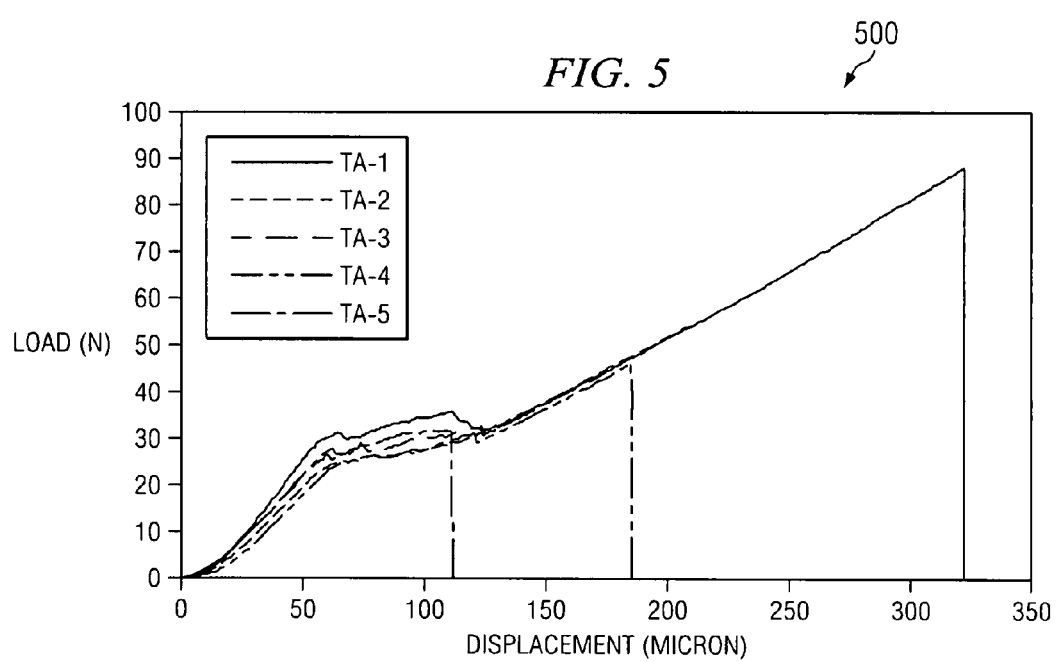
FIG. 5 illustrates example theoretical results associated with the Four-Point Bend test structure according to one embodiment of this disclosure.
Figure 6:
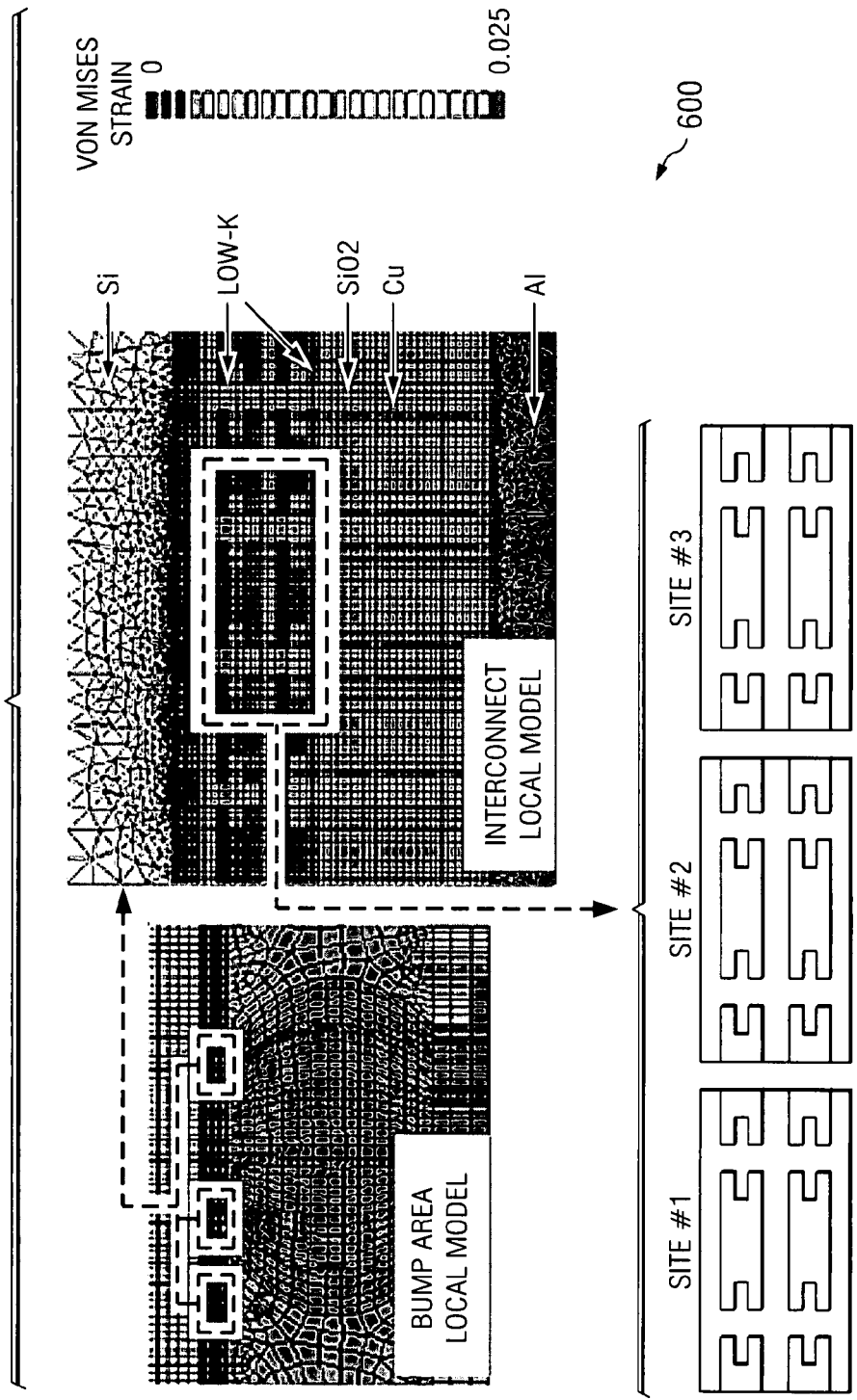
FIG. 6 illustrates an example modeling of a flip chip ball grid array (FCBGA) to quantify a cohesive crack phenomenon according to one embodiment of this disclosure.

Interfacial adhesion energy of the copper and low-K material interfaces may be studied using a Four-Point Bend test structure 400 (shown in FIG. 4) or using nano-scratch/nano-indentation tests. The theoretical results 500 using the Four-Point Bend test structure are shown in FIG. 5. The theoretical results 500 plot the displacement in microns versus the load in Newtons. In addition, a finite element method may be used to model the interconnect structure 200. FIG. 6 illustrates the modeling 600 of a flip chip ball grid array (FCBGA) to quantify a cohesive crack phenomenon, allowing the effective strain contours to be compared. Sites #2 and #3 (the two sites located underneath the bump corners) may be the most critical ones. Moreover, with the considered patterning, these results highlight that the most strained layers may be located at the extreme inter-metal dielectric (IMD) layers (IMD1 and IMD4). As a result, the most likely areas for a cohesive crack initiation may be found to be the top and bottom low-K dielectric layers just below the two bump corners. The use of the interconnect structure 200 may help to avoid these types of cohesive cracks.

Accordingly, embodiments the present disclosure could help to increase the mechanical strength of the low-K material or the entire interconnect structure.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods have been set forth by implication and will be apparent to those skilled in the art. For example, some embodiments of this disclosure could have metal lines corresponding to the aforementioned metal lines 102 and 202, where the metal lines are formed of gold, silver, all-metal alloy, part-metal alloy, non-metallic conductive material, or any other suitable material or combination of materials.

As another example, some embodiments of this disclosure could have one or multiple low-K materials, and each low-K material could include carbon nanotubes and/or nanopores. As yet another example, some embodiments of this disclosure could have aligned or unaligned carbon nanotubes, and aligned carbon nanotubes could be aligned in any suitable orientation or pattern (such as honeycomb, hexagonal, checkerboard, triangular, labyrinth, Archimedean spiral, logarithmic spiral, kagome lattice, or a combination of one or more patterns). Accordingly, the above description of example embodiments does not define or constrain this disclosure. Other changes, substitutions, and alterations are also possible without departing from the spirit and scope of this disclosure, as defined by the following claims.

What is claimed is:

1. An interconnect structure, comprising:
a low-K dielectric material modified with a first group of hollow carbon nanotubes (CNTs) and disposed on a metal line having a top layer and a bottom layer connected by a metal via,
wherein the low-K material modified with the first group of CNTs has a lower dielectric constant than a same low-K material that is not modified with a group of CNTs, wherein the modification with the first group of CNTs decreases the dielectric constant of the low-K material,
wherein the CNTs are mixed with the low-K material and at least some of the CNTs are burned to leave nanopores in the low-K material, and
wherein an amount of the CNTs is chosen to tune at least a Young's modulus of the low-K material to a predetermined value.

2. The structure of claim 1, wherein the low-K material comprises a dielectric.

3. The structure of claim 1, wherein the low-K material comprises at least one of: a silicon oxycarbide, an organic polymer, a fluorosilicate glass, and a black diamond.

4. The structure of claim 1, further comprising:
a silicon nitride layer disposed on the top layer and the low-K material.

5. The structure of claim 1, further comprising:
a second low-K material modified with a second group of hollow CNTs and disposed adjacent a portion of the top layer and the bottom layer.

6. The structure of claim 1, wherein the CNTs are configured in a honeycomb pattern.

7. The structure of claim 1, wherein the amount of the CNTs is chosen to tune a thermal conductivity of the low-K material to a predetermined value.

8. The structure of claim 1, wherein the CNTs are configured in a triangular pattern.

9. The structure of claim 1, wherein the first group of hollow CNTs comprise at least one of: a nano-wire filling, a metallic nano-structure, and a non-metallic nano-structure.

10. A method of forming an interconnect structure, the method comprising:
providing a first low-K material modified with a first group of hollow carbon nanotubes (CNTs), comprising:
mixing the CNTs with the low-K material, and
burning at least some of the CNTs to leave nanopores in the low-K material;
providing a metal line having a top layer and a bottom layer disposed on the first low-K material; and
providing a second low-K material modified with a second group of hollow CNTs disposed on the first low-K material,
wherein each of the first and second modified low-K materials has a lower dielectric constant than a same low-K material that is not modified with a group of CNTs, wherein the modifications with the first and second groups of CNTs decreases the dielectric constants of the low-K materials,
wherein an amount of the CNTs is chosen to tune at least a Young's modulus of the low-K material to a predetermined value.

11. The method of claim 10, wherein the step of providing the first low-K material further comprises:
dispersing the first group of CNTs in a solution;
spinning the solution onto a silicon wafer; and
curing the solution to form the first low-K material modified with the first CNTs.

12. The method of claim 11, wherein the first group of CNTs are cut uniformly before dispersing into the solution.

13. The method of claim 10, further comprising:
a second low-K material disposed adjacent a portion of the top layer and the bottom layer, wherein the second low-K material is not modified with hollow CNTs.

14. The method of claim 10, wherein the first low-K material comprises at least one of: a silicon oxycarbide, an organic polymer, a fluorosilicate glass, and a black diamond.

15. The method of claim 10 further comprising:
disposing a silicon nitride layer on the top metal layer and the first low-K material.

16. The method of claim 10, wherein the amount of the CNTs is chosen to tune a thermal conductivity of the low-K material to a predetermined value.

17. The method of claim 10, wherein the first CNTs are configured in a checkerboard pattern.

18. The method of claim 10, wherein the first group of hollow CNTs comprise at least one of: a nano-wire filling, a metallic nano-structure, and a non-metallic nano-structure.

19. For use in an integrated circuit, an interconnect structure comprising:
a first low-K dielectric material modified with a first group of hollow carbon nanotubes (CNTs) and disposed on a metal line having a top layer and a bottom layer connected by a metal via, the low-K material modified with the first group of CNTs having a lower dielectric constant than a same low-K material that is not modified with a group of CNTs, wherein the modification with the first group of hollow CNTs decreases the dielectric constant of the first low-K dielectric material, wherein the CNTs are mixed with the low-K material and at least some of the CNTs are burned to leave nanopores in the low-K material, wherein an amount of the CNTs is chosen to tune at least a Young's modulus of the low-K material to a predetermined value;
a second low-K dielectric material modified with a second group of hollow CNTs and disposed on the bottom layer, wherein the modification with the second group of hollow CNTs decreases the dielectric constant of the second low-K dielectric material; and
a silicon nitride layer disposed on the top layer and the first low-K dielectric material.

20. The structure of claim 19, wherein the first low-K dielectric material comprises at least one of: a silicon oxycarbide, an organic polymer, a fluorosilicate glass, and a black diamond.

* * * * *

UNITED STATES PATENT AND TRADEMARK OFFICE
CERTIFICATE OF CORRECTION

| | | |
|---|---|---|
| PATENT NO. | : 8,592,980 B2 | |
| APPLICATION NO. | : 11/715260 | |
| DATED | : November 26, 2013 | |
| INVENTOR(S) | : Wang et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 180 days.

Signed and Sealed this
Twenty-first Day of April, 2015

Michelle K. Lee
*Director of the United States Patent and Trademark Office*